United States Patent
Kinzer et al.

(10) Patent No.: US 7,439,580 B2
(45) Date of Patent: Oct. 21, 2008

(54) TOP DRAIN MOSGATED DEVICE AND PROCESS OF MANUFACTURE THEREFOR

(75) Inventors: Daniel M. Kinzer, El Segundo, CA (US); David Paul Jones, South Glamorgan (GB); Kyle Spring, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 382 days.

(21) Appl. No.: 11/217,870

(22) Filed: Sep. 1, 2005

(65) Prior Publication Data

US 2006/0043474 A1 Mar. 2, 2006

Related U.S. Application Data

(60) Provisional application No. 60/606,596, filed on Sep. 2, 2004.

(51) Int. Cl.
*H01L 29/94* (2006.01)
*H01L 29/76* (2006.01)

(52) U.S. Cl. .................. 257/330; 257/328; 257/329; 257/331; 257/E21.538; 257/E21.661

(58) Field of Classification Search .............. 257/328, 257/330, 331
See application file for complete search history.

(56) References Cited

U.S. PATENT DOCUMENTS 5,023,196 A * 6/1991 Johnsen et al. .............. 438/270

| 5,134,448 | A | 7/1992 | Johnsen et al. ............. 357/23.4 |
| 5,760,440 | A | 6/1998 | Kitamura et al. |
| 2005/0173741 | A1* | 8/2005 | Spring ........................ 257/288 |
| 2005/0194636 | A1* | 9/2005 | Kinzer ....................... 257/330 |

FOREIGN PATENT DOCUMENTS

EP 0440394 A2 1/1991
JP 03185737 A 8/1991

OTHER PUBLICATIONS

Office Action issued in corresponding Japanese Application No. 2005-255650 dated Mar. 11, 2008.

* cited by examiner

*Primary Examiner*—Dao H Nguyen
(74) *Attorney, Agent, or Firm*—Ostrolenk, Faber, Gerb & Soffen, LLP

(57) ABSTRACT

A trench type top drain MOSgated device has a drain electrode on the die top and a source electrode on the die bottom surface. The device is turned on by a control voltage connected between a drain and a gate region. The device cell has a body short trench and a gate trench. Gate poly is disposed in the bottom of the gate trench and is disposed adjacent a thin gate oxide lining a channel region with minimum overlap of the drain drift region. The bottom of the body short trench contains a contact which shorts the body region to the channel region. The body short, top drain region and gate polysilicon are simultaneously silicided. The gate trench is widened at its top to improve $Q_{gd}$ characteristics. Both the body short trench and gate trench are simultaneously filled with gap fill material.

11 Claims, 3 Drawing Sheets

US 7,439,580 B2

TOP DRAIN MOSGATED DEVICE AND PROCESS OF MANUFACTURE THEREFOR

RELATED APPLICATIONS

This application claims the benefit and priority of U.S. Provisional Application No. 60/606,596, filed Sep. 2, 2004 the entire disclosure of which is incorporated by reference herein.

This application is also related to U.S. patent application Ser. No. 11/042,993, filed Mar. 4, 2005, in the name of Daniel M. Kinzer, entitled TOP DRAIN MOSFET, the entire disclosure of which is also incorporated herein by reference.

FIELD OF THE INVENTION

This invention relates to MOSgated devices such as MOSFETs, IGBTs and the like and to a process for their manufacture, and more specifically relates to such devices in which the drain electrode is disposed on the top surface of the junction containing surface of the die or wafer in which the device is formed.

BACKGROUND OF THE INVENTION

Vertical conduction MOSgated devices are well known. By MOSgated device is meant a MOSFET, IGBT or the like. By a vertical conduction device is meant a device in which at least a portion of the current conduction path through the die is perpendicular to the plane of the die. By die is meant a single die or chip which is singulated from a wafer in which all die within the wafer are simultaneously processed before singulation. The terms die, wafer and chip may be interchangeably used.

FIG. 1 shows a known type of vertical conduction MOSFET, using a trench type technology. FIG. 1 is a cross-section through a MOSFET die and shows one cell of a device. A plurality of identical such cells which are laterally disposed relative to one another are conventionally employed. These cells may be parallel stripes, or closed cells of circular, rectangular, square, hexagonal or any other polygonal topology and may appear identical in a cross-sectional view. The device of FIG. 1 has its drain on the bottom of the die and the source and gate on the opposite surface.

In FIG. 1, the wafer or die has an $N^+$ substrate 20 of monocrystalline silicon (float zone, for example) which has a top epitaxially grown N type silicon layer, which includes drift region 21. A P type base implant and diffusion into the epitaxial layer forms the P base region 22, and an N type implant and diffusion forms the $N^+$ source region layer 23. Spaced trenches 24 and 25 (or spaced, or enclosed cells) are formed in the top of the wafer. A silicon dioxide or other insulation liner has a thick bottom section 30 and a thin vertical gate section 31 which receive a conductive polysilicon gate electrode 32. A top oxide segment 33 completes an insulated enclosure for gate polysilicon 32. A source electrode 40 is then deposited atop the wafer or chip and fills trench 24 to short the $N^+$ source 23 to the P base, thereby to disable the parasitic bipolar transistor formed by regions 21, 22 and 23. A conductive drain electrode 41 is conventionally formed on the bottom of the die.

In operation, the application of a gate turn-on potential to gate 32 relative to source 40 will invert the concentration at the surface of P base 22 which lines oxide 31, thus permitting the vertical flow of majority carriers from drain 41 to source 40.

It would be very desirable for many applications to reduce the capacitance between the gate and drain and thus the charge $Q_{gd}$ and Q switch and to reduce the on resistance $R_{DSON}$ and gate resistance of the MOSgated device die of FIG. 1. It would also be desirable to provide a MOSgated die structure which can be packaged in a variety of housings and can be copacked in a package with other die with reduced package resistance, minimal stray inductance, and good heat sinking capability.

Top drain MOSgated devices are broadly shown, in copending application Ser. No. 11/042,993, filed Mar. 4, 2005, in the name of Daniel M. Kinzer, entitled TOP DRAIN MOSFET (IR-2471) and assigned to the assignee of this coinvention. Such devices have reversed source and drain electrodes as compared to those of a conventional MOSFET. Thus, both the drain structure and gate structure are formed in the top of the chip, and the source is at the bottom of the chip. Spaced vertical gate trenches are formed into the top of the die or wafer. A base or channel invertible region is disposed adjacent the trench wall and is burried beneath an upper drift region. A further trench or cell disposed between the gate trenches permits the formation of a conductive region at its bottom to short the buried P base to the $N^+$ substrate.

This novel reversal of functions produces a significant improvement in $R^*Q_{sw}$ and $R^*A$ over current technology (60% and 26% respectively). It further enables a four times reduction in gate resistance and enables multiple packaging options for the copackaging of die.

More specifically, the structure permits a reduction of the drain to gate overlap and the use of a thicker oxide between gate and drain, thus producing a reduced $Q_{gd}$ and $Q_{sw}$. The design also allows the use of higher cell density and the elimination of the JFET effect both reduce $R_{DSON}$. Finally, the design permits the reduction of gate resistance.

BRIEF DESCRIPTION OF THE INVENTION

FIG. 2 is a schematic cross-section of one cell of the novel top drain device of the present invention. The device is shown as an N channel device, but all conductivity types can be reversed to produce a P channel device. The die or wafer has an $N^+$ substrate 50 which has an $N^-$ type epitaxial silicon layer formed on its upper surface. A P type implant and diffusion forms the buried P base or channel 51, and an $N^+$ implant and diffusion forms the drain region layer 52, into the top of an N drift region layer 53. Three trenches 60, 61 and 62 are formed into the top of the die or wafer, forming the single cell shown. The outer trenches 60 and 62 are gate trenches and have vertical silicon dioxide (or other insulation) bottom layers 63 and 64 respectively, and vertical gate oxide layers 65 and 66 respectively. Conductive polysilicon layers 67 and 68 are formed into trenches 60 and 62 and are insulated from the surrounding silicon by the oxide layers 63, 65 and 64, 66 respectively. Oxide fillers 69 and 70 then fill the trenches 60 and 62 above polysilicon gates 67 and 68 respectively.

The central trench 61 receives a conductive layer 71 at its bottom to connect (short) the P base 51 to the $N^+$ substrate 50. The remainder of the trench 61 is then filled with insulation oxide 72.

A drain electrode 75, which may be aluminum with a small silicon content is formed over the top of the die or wafer, and a conductive source electrode 76 is formed on the wafer or die bottom.

To turn the device of FIG. 2 on, a potential applied to gate 67, 68 relative to substrate 50 will form an inversion region along the vertical surfaces of base regions 51 to enable the conduction of majority carriers (electrons) from top drain 75 to bottom source electrode 76. Note again that all conductivity types can be reversed to form a P channel device, rather than the N channel device shown.

The effect of the structure of FIG. 2 permits a reduced overlap between the drain drift region 53 and gates 67, 68 producing a lower $Q_{gd}$ and $Q_{sw}$ as compared to that of FIG. 1. Further, a thicker oxide 65, 66 can be used between the gates 67, 68 and drain drift region 53, again reducing $Q_{gd}$ and $Q_{sw}$. Further, the cell density may be greater than that of FIG. 1 to reduce $R_{DSON}$, still further, the elimination of the JFET effect further reduces $R_{DSON}$.

In general, the Figure of Merit (FOM) of the structure of the top drain devices of FIG. 2 is considerably reduced as compared to that of the device of FIG. 1 for an equivalent design for a 20 volt N channel MOSFET commercially sold by the International Rectifier Corporation as shown in the following Table 1.

TABLE 1

| Technology FOM's | FIG. 1 (1.8 um pitch) Measured | FIG. 2 Top Drain FET (1.8 um pitch) Simulated | % Reduction in FOM over Conventional Device |
| --- | --- | --- | --- |
| $R_{si}$xAA @ Vgs = 4.5 V (mΩ-mm2) | 15.5 | 11.5 | 26% |
| $R_{si}$xQswitch (mΩ-nC) | 48.3 | 19.1 | 60% |
| $R_{si}$xQgd (mΩ-nC) | 38.6 | 17.0 | 56% |
| $R_{si}$xQgd (mΩ-nC) | 103.7 | 36.9 | 64% |

The present invention further includes a series of improvements in the structure and process of the manufacture of device of FIG. 2.

Thus, as a first improvement, the body short, drain region and the gate polysilicon are simultaneously silicided at their upper surface to reduce the respective resistances.

Further, the drain oxide thickness between the polysilicon gate and its trench wall is increased to minimize $Q_{GD}$ sensitivity.

Further, for process simplicity, the body short trench and main trench are filled simultaneously.

As a still further process improvement, a novel sequential etch process is provided for the gate poly recess. Thus, the gate poly recess must be precisely controlled to keep a minimal capacitance. For this purpose, when doing the active trench etch, there is a first etch to a first depth, then the formation of a thick oxide, followed by a nitride deposition and anisotropic etch of the trench bottom. Then a second etch is carried out and gate oxide is formed on the on new surface. The poly recess depth is now less critical because the thick oxide at top of trench reduces gate capacitance. The etches are self aligned and an angle implant can be used so that the trench depth is further less critical. A shallow poly recess can be provided for a silicide gate.

The above described features are described in detail in the following description of a preferred process sequence of FIGS. 3 to 6 which lead to a device such as that schematically shown in FIG. 2.

DETAILED DESCRIPTION OF THE PREFERRED EMBODIMENT

Figure 3:
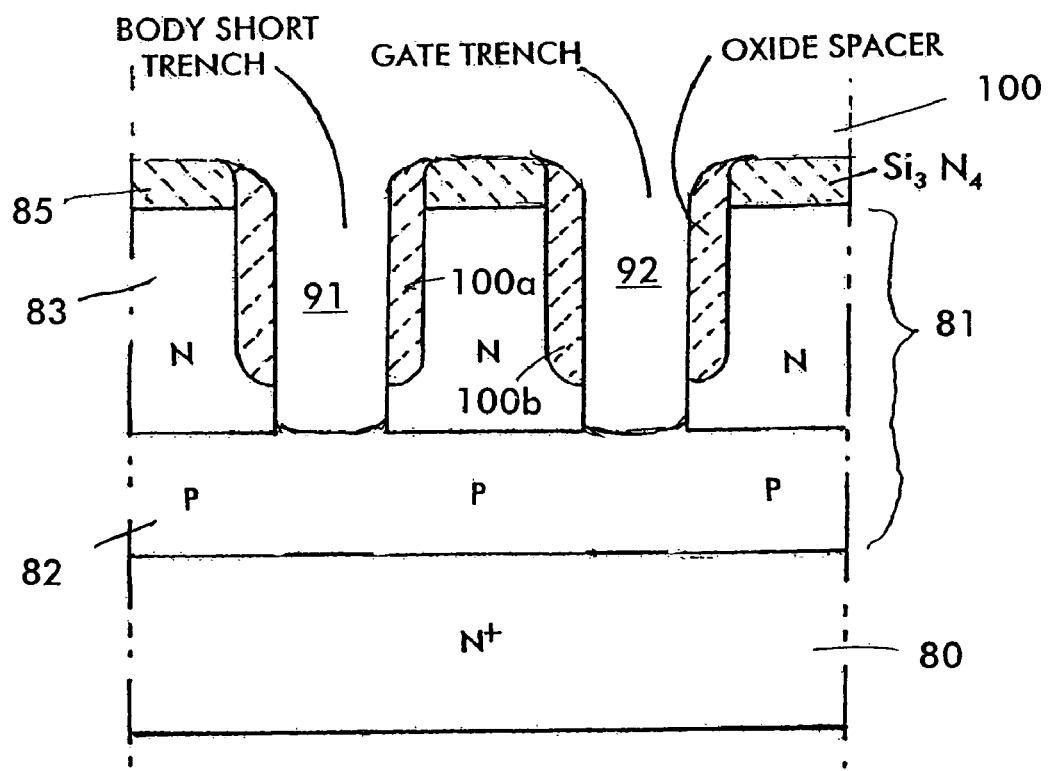
FIG. 3 is a cross-section of a cell made in accordance with the invention after an early process sequence in which a body trench and gate trench are formed.

Referring first to FIG. 3, there is shown one cell (with a trench and a body short trench in a die or wafer. Thus, the die comprises an N⁺ body 80 having an epitaxial layer 81 on its top surface. A P type layer 82 is implanted and diffused into layer 81 or, alternatively, the P layer or channel layer 82 can be diffused into N⁺ body 80 prior to the formation of the epitaxial layer. An N type drift region 83 is then implanted and diffused (or grown) atop P layer 82.

A silicon nitride layer 85 is then deposited atop the layer 83.

A body short trench 91 and a gate trench 92 are then etched through the nitride layer 85 into drift region 83, using conventional mask and etch steps well known to those skilled in the art and dividing region 83 into spaced mesa portions.

A relatively thick oxide spacer layer 100 is then formed over the tops of the mesas formed by trenches 91 and 92 and into the trenches. The oxide is then etched to form oxide spacers on the sides of the drift regions 83, shown as oxide layers 100a in trench 91 and oxide layers in trench 92. Oxide layers 100a and 100b are drain oxide layers and are relatively thick so as to minimize $Q_{gd}$ sensitively as will be later seen.

The silicon is then etched again to deepen the trench to the bottom of the base region 82.

Thereafter, relatively thin gate oxide layers 110 and 111 are grown in the walls and bottom of trenches 91 and 92. These are relatively thin compared to the thickness of drain oxide layers 100a and 100b to permit a relatively low threshold voltage to turn on the device.

Figure 4:
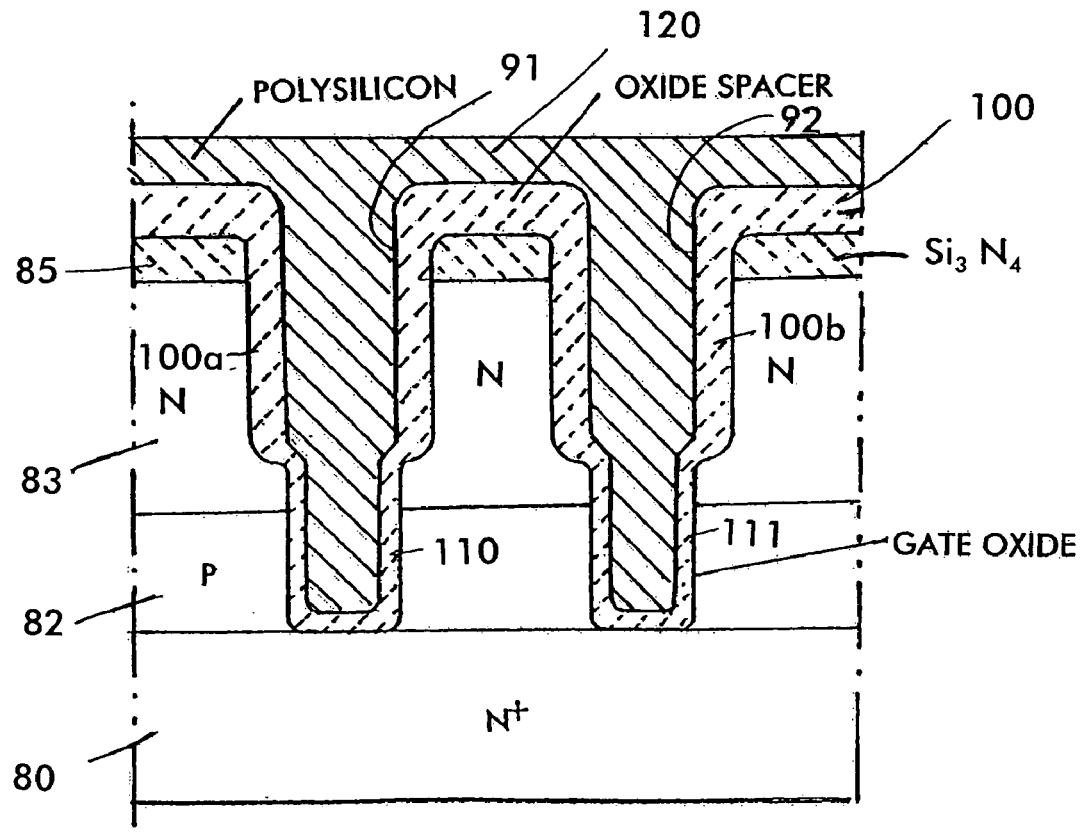
FIG. 4 is a cross-section like that of FIG. 3 after the trenches are filled with polysilicon.

As next shown in FIG. 4, a conductive polysilicon layer 120 is deposited atop the wafer or die, filling all trenches 91 and 92.

Figure 5:
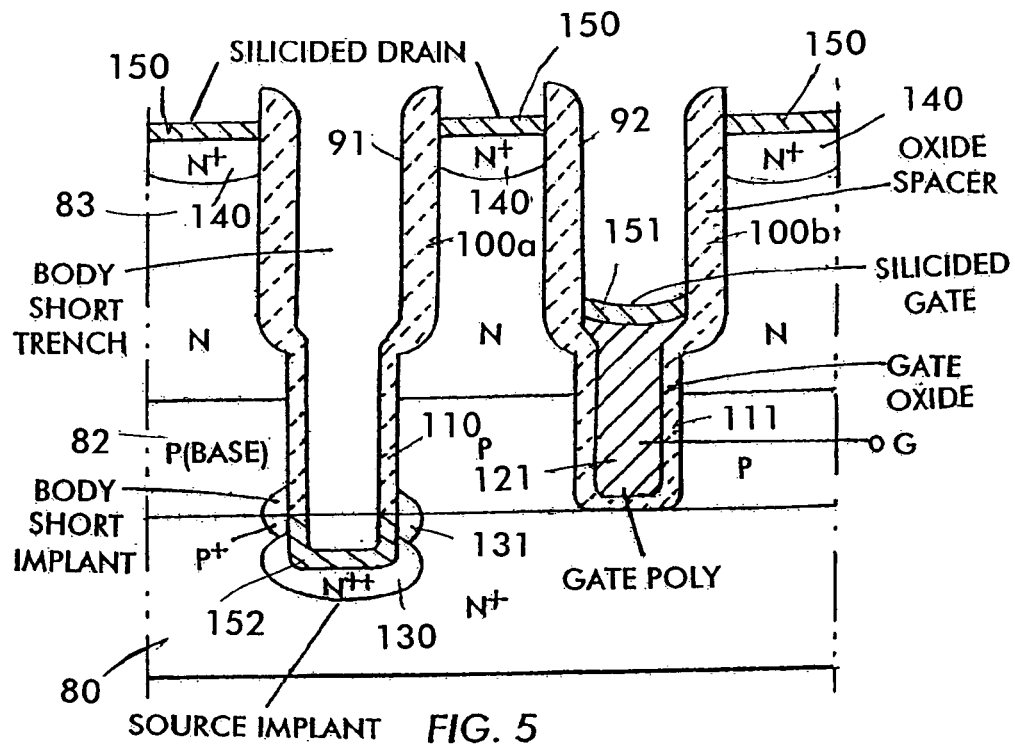
FIG. 5 is a cross-section like that of FIG. 4 after selective removal of polysilicon, the implanting of selected regions and the siliciding of the drain source and gate regions.

The polysilicon 120 is then etched partically out of trenches 91 and 92, leaving the height of gate polysilicon 121 in the bottom of trench 92 to slightly above the level of the gate oxide section 111 as shown in FIG. 5. Trench 92 is then masked and the polysilicon remaining in trench 91 is fully etched, as shown in FIG. 5. The oxide layer 100 and the nitride layer 85 over the mesas is also removed as shown in FIG. 5.

A P⁺ implant is implanted into the base of trench 91, then the trench is etched deeper as shown in FIG. 5.

Note in FIG. 5, that a highly conductive N⁺⁺ source implant 130 is formed in the bottom of trench 91 and a P⁺ body implant 131 is formed above N⁺⁺ implant 130. These enable an effective body short of body 80 to base 82 to be made, which is the ultimate purpose of trench 91.

An N⁺ source implant and activation is then carried out in FIG. 5 to form N⁺ drain regions 140.

A siliciding operation is next carried out in FIG. 5 to form conductive silicide layers 150 over the drain regions 140, and a silicide layer 151 atop gate polysilicon 121. The same conductive silicide may also be applied to the bottom of trench 91, as silicide 152 to electrically short N⁺ body 80 to P type channel 82, through regions 130 and 131.

Figure 6:
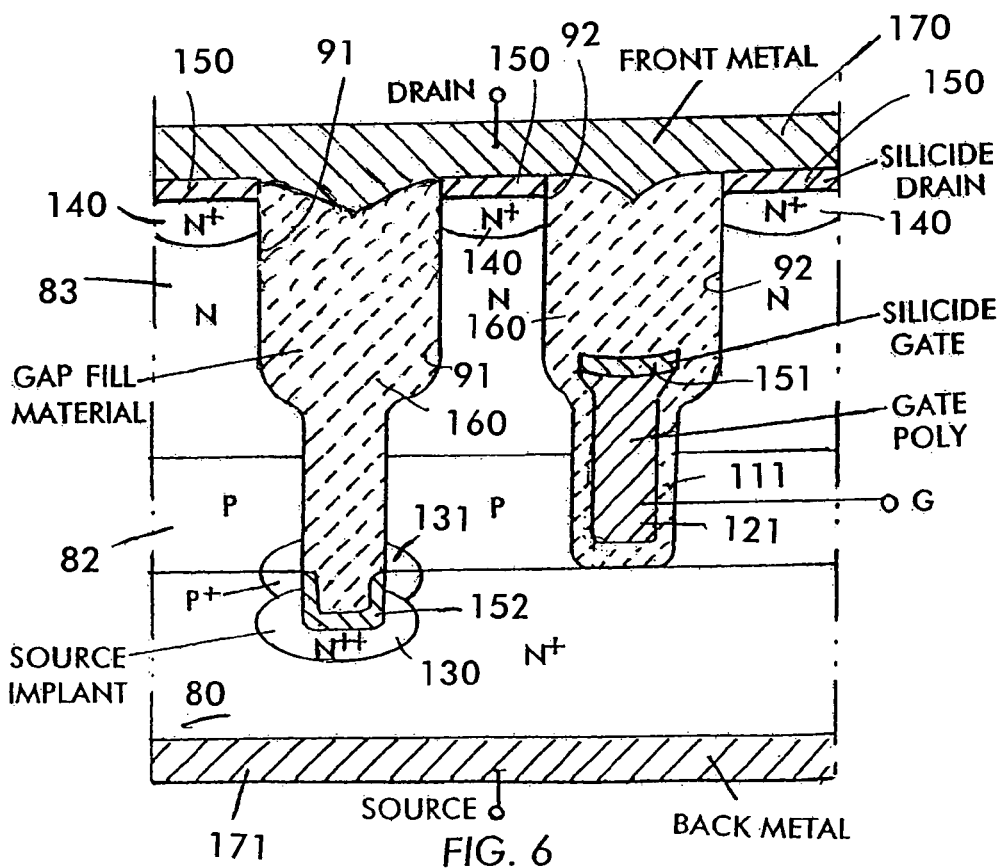
FIG. 6 is a cross-section like that of FIG. 5 after metal deposition.

A suitable gap filling material 160, which may be a suitable oxide, then fills both of trenches 91 and 92 of FIG. 5. As shown in FIG. 6, the gap fill material is removed from the mesas between the channels. A front metal 170, which is the drain metal electrode, is then applied to the top of the die or wafer, contacting drain regions 140. A back metal 171 in FIG. 6 (the device source metal) is then applied to the bottom of the wafer.

Figure 1:
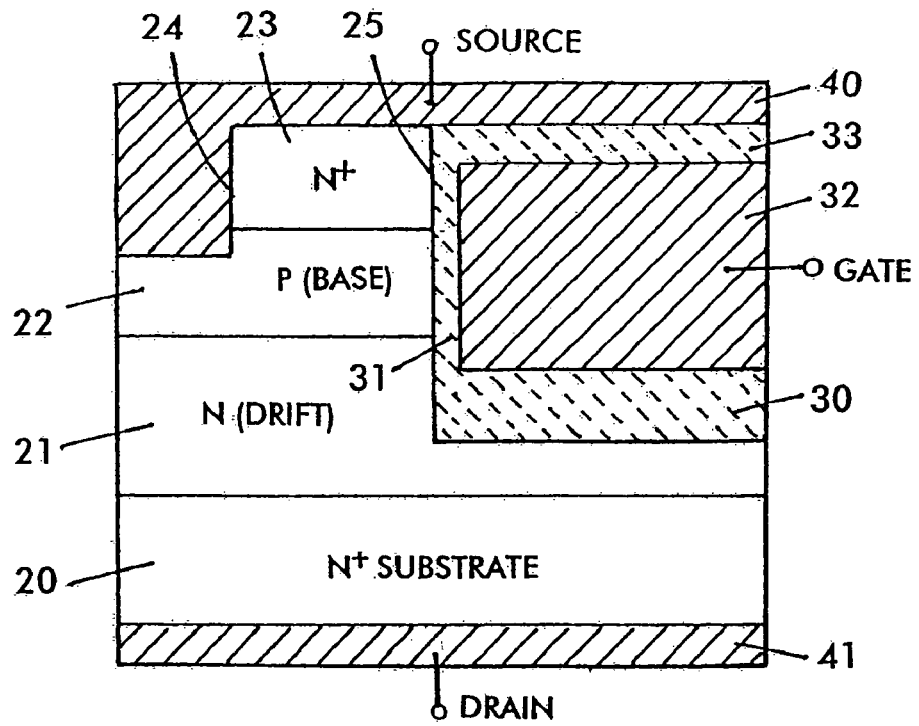
FIG. 1 is a cross-section of a cell of a prior art trench type MOSFET.
Figure 2:
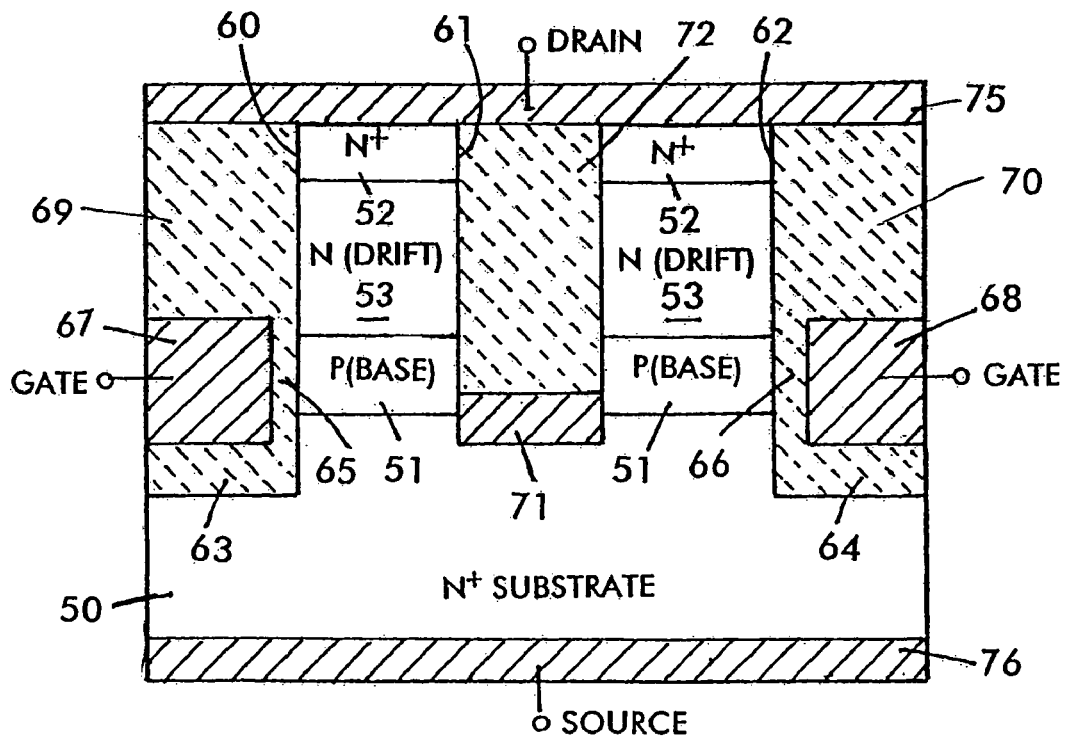
FIG. 2 is a cross-section of a cell of a top drain type MOSFET.

It will be noted that the device of FIG. 6 will operate as has been described in FIG. 2.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A top drain MOSgated device comprising a semiconductor body of one conductivity type; a base layer of a conductivity type opposite to said one conductivity type atop said semiconductor body; a drift region of said one conductivity type atop said base layer; a plurality of laterally spaced MOSgated cells, each of said cells comprising a body-short trench and a gate trench spaced from said body-short trench and defining a mesa between said trenches; said body-short trench and said gate trench extending generally perpendicular to the plane of said semiconductor body, and extending through said drift region and said base layer; said body-short trench having a body-short contact at the bottom thereof connecting said base layer to said semiconductor body; said gate trench having a gate oxide lining the walls thereof which extends along at least a portion of the depth of said base layer; a conductive polysilicon gate electrode filling the bottom of said gate trench; an increased conductivity drain region formed at the top of said mesa; a conductive drain front electrode connected to said increased conductivity drain region; a conductive source electrode connected to the bottom of said semiconductor body;

an implant region of said one conductivity type and greater concentration of charge than said semiconductor body at bottom of said body short trench to improve the contact between said body-short contact and said semiconductor body; and a body short implant of said opposite conductivity type and a higher conductivity than said base layer which spans along said body-short trench from a lower portion of said base layer and makes contact with said body-short contact.

2. The device of claim 1, wherein said one conductivity type is the N type conductivity.

3. The device of claim 1, which further includes a conductive silicide layer atop said polysilicon gate electrode, and said increased concentration drain region.

4. The device of claim 3, wherein said contact at the bottom of said body short trench is a conductive silicide.

5. The device of claim 1, wherein said contact at the bottom of said body short trench is a conductive silicide.

6. The device of claim 1, wherein said gate trench has a first width at the bottom thereof and along its length through said base layer, and a second width at the top thereof extending to said first width; said second width being filled with an insulation filler and being wider than said first width.

7. A top drain MOSgated device comprising a semiconductor body of one of the conductivity types; a base layer of the opposite conductivity type atop said semiconductor body; a drift region of said one conductivity type atop said base layer; at least one gate trench extending generally perpendicular to the plane of said semiconductor body and extending through said drift region and said base layer; said gate trench having a gate oxide lining the walls thereof along at least a portion of the depth of said base layer; a conductive polysilicon mass defining a gate electrode filling the bottom of said gate trench along the length of said gate oxide; a conductive drain electrode connected to the top surface of said drift region layer; a conductive source electrode connected to said semiconductor body;

a body-short trench spaced from said gate trench and extending from the top of said drift region and into said semiconductor body; a conductive body-short contact disposed at the bottom of said body-short trench;

an implant region of said one conductivity type and higher concentration than said semiconductor body at bottom of said body-short trench to improve the contact between said body-short contact and said semiconductor body; and a body-short implant of said opposite conductivity type and a higher conductivity than said base layer which spans along said body-short trench from a lower portion of said base layer and makes contact with said body-short contact.

8. The device of claim 7, which further includes an increased conductivity drain region of said one of the conductivity type formed in the top of said drift region for improving the contact to said conductive drain electrode.

9. The device of claim 8, which further includes a conductive silicide layer atop said polysilicon gate electrode, and said increased concentration drain region.

10. The device of claim 7, wherein said one conductivity type is the N type conductivity.

11. The device of claim 7, wherein said body-short contact is a conductive silicide.

* * * * *